(12) United States Patent
Nakane

(10) Patent No.: US 11,275,045 B2
(45) Date of Patent: Mar. 15, 2022

(54) SENSOR

(71) Applicant: MINEBEA MITSUMI Inc., Nagano (JP)

(72) Inventor: Taketomo Nakane, Tokyo (JP)

(73) Assignee: MINEBEA MITSUMI Inc., Nagano (JP)

( * ) Notice: Subject to any disclaimer, the term of this patent is extended or adjusted under 35 U.S.C. 154(b) by 75 days.

(21) Appl. No.: 16/675,558

(22) Filed: Nov. 6, 2019

(65) Prior Publication Data

US 2020/0158674 A1 May 21, 2020

(30) Foreign Application Priority Data

Nov. 16, 2018 (JP) .............................. JP2018-215855

(51) Int. Cl.
*G01N 27/22* (2006.01)
*G01N 27/04* (2006.01)
*H01L 29/72* (2006.01)
*H01L 29/66* (2006.01)

(52) U.S. Cl.
CPC ......... *G01N 27/223* (2013.01); *G01N 27/048* (2013.01); *H01L 29/66545* (2013.01); *H01L 29/72* (2013.01)

(58) Field of Classification Search
None
See application file for complete search history.

(56) References Cited

U.S. PATENT DOCUMENTS

| 9,239,308 | B2 | 1/2016 | Tondokoro et al. | |
| 2003/0179001 | A1* | 9/2003 | Ito ..................... | G06K 9/00053 324/661 |
| 2006/0186901 | A1* | 8/2006 | Itakura ................ | G01N 27/223 324/689 |
| 2013/0207673 | A1* | 8/2013 | Tondokoro ........... | G01N 27/223 324/664 |
| 2014/0077824 | A1* | 3/2014 | Niimi .................. | G01N 27/223 324/664 |

FOREIGN PATENT DOCUMENTS

JP          5547296       7/2014

* cited by examiner

*Primary Examiner* — Jermele M Hollington
*Assistant Examiner* — Suresh K Rajaputra
(74) *Attorney, Agent, or Firm* — IPUSA, PLLC

(57) ABSTRACT

A sensor includes a semiconductor substrate, a detector disposed above the semiconductor substrate and configured to output a signal in accordance with a physical quantity, an electrostatic discharge protection circuit including a metal-oxide-semiconductor transistor, and a dummy pattern formed above the semiconductor substrate and formed of a same material as a material of a gate electrode, the gate electrode being included in the electrostatic discharge protection circuit.

12 Claims, 17 Drawing Sheets

SENSOR

CROSS-REFERENCE TO RELATED APPLICATIONS

This application is based on and claims priority to Japanese Patent Application No. 2018-215855, filed on Nov. 16, 2018, the entire contents of which are incorporated herein by reference.

BACKGROUND OF THE INVENTION

1. Field of the Invention

The disclosures herein relate to a sensor such as a humidity sensor.

2. Description of the Related Art

As a humidity sensor, an electrostatic-capacitance-type humidity sensor is known, in which a humidity sensing film, formed of a polymeric material whose dielectric constant varies depending on the amount of absorbed moisture, is used as a dielectric substance. In the electrostatic-capacitance-type humidity sensor, the humidity sensing film is disposed between electrodes, and the humidity (relative humidity) is determined by measuring the electrostatic capacitance between the electrodes (see Patent Document 1, for example).

As an electrode structure of the electrostatic-capacitance-type humidity sensor, a comb structure and a parallel-plate structure are known. The comb structure is a structure in which a pair of opposed comb electrodes are provided on the same plane and a humidity sensing film is provided on the pair of comb electrodes. The parallel-plate structure is a structure in which a humidity sensing film is provided between a lower electrode disposed on a substrate and an upper electrode disposed facing the lower electrode.

As the material of the humidity sensing film, a polyimide is typically used.

The distance between the electrodes of the electrostatic-capacitance-type humidity sensor is as small as 0.2 μm to 2 μm, and the humidity sensitive film is a thin film. Thus, electrostatic breakdown becomes a problem. As the humidity sensor is manufactured by mounting a sensor chip onto another substrate, there may be a possibility that electrostatic breakdown of the sensor chip may occur from the time when a device pattern is formed on a wafer until the sensor chip is mounted. If static electricity is generated in manufacturing equipment during a manufacturing process, electrostatic breakdown may occur, thereby causing reduction in yield.

RELATED-ART DOCUMENTS

Patent Documents

Patent Document 1: Japanese Patent No. 5547296

SUMMARY OF THE INVENTION

It is a general object of the present invention to improve the yield in a manufacturing process.

According to at least one embodiment, a sensor includes a semiconductor substrate, a detector disposed above the semiconductor substrate and configured to output a signal in accordance with a physical quantity, an electrostatic discharge protection circuit including a metal-oxide-semiconductor transistor, and a dummy pattern formed above the semiconductor substrate and formed of a same material as a material of a gate electrode, the gate electrode being included in the electrostatic discharge protection circuit.

BRIEF DESCRIPTION OF THE DRAWINGS

Other objects and further features of the present invention will be apparent from the following detailed description when read in conjunction with the accompanying drawings, in which.

DESCRIPTION OF THE EMBODIMENTS

Figure 1A:
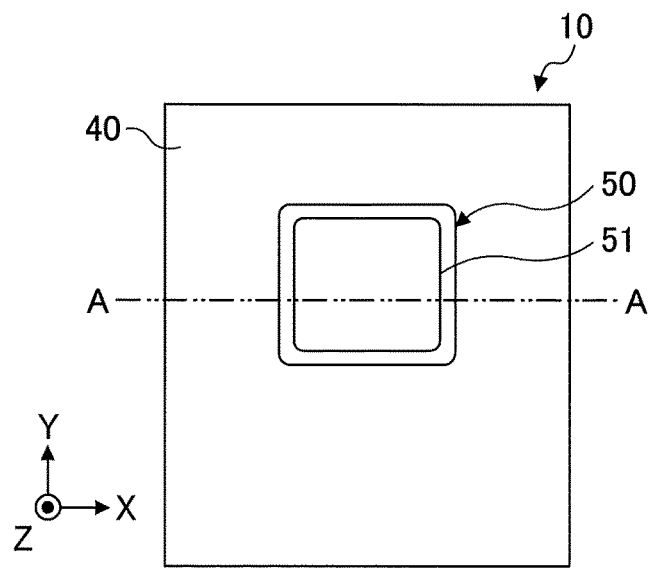
FIG. 1A through FIG. 1C are diagrams illustrating a schematic configuration of a humidity sensor according to an embodiment of the present invention.

According to an embodiment of the present invention, it is possible to improve the yield in a manufacturing process.

In the following, embodiments of the present invention will be described with reference to the accompanying drawings. In the drawings, the same elements are denoted by the same reference numerals, and a duplicate description thereof may be omitted. As used herein, "humidity" refers to "relative humidity".

[Schematic Configuration]

A humidity sensor 10 according to an embodiment of the present invention will be described.

Figure 1C:
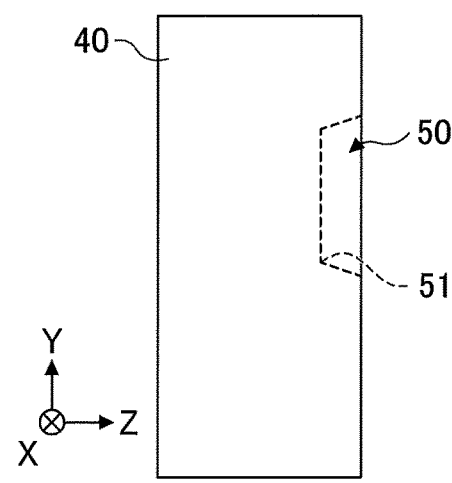
Figure 1B:
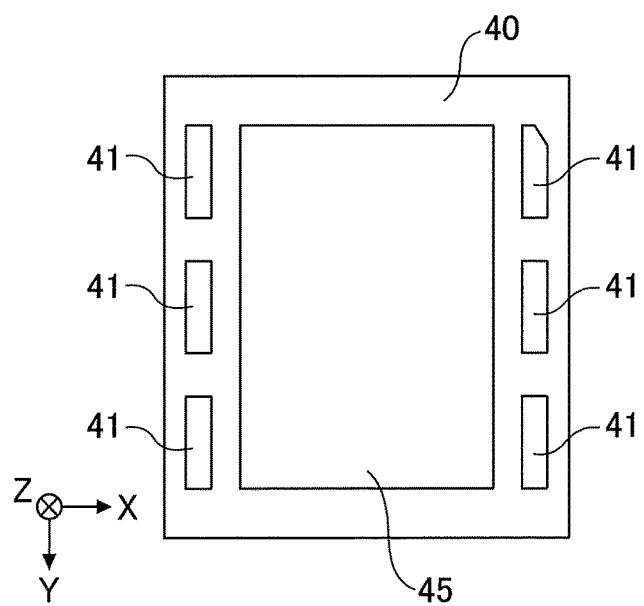
Figure 2:
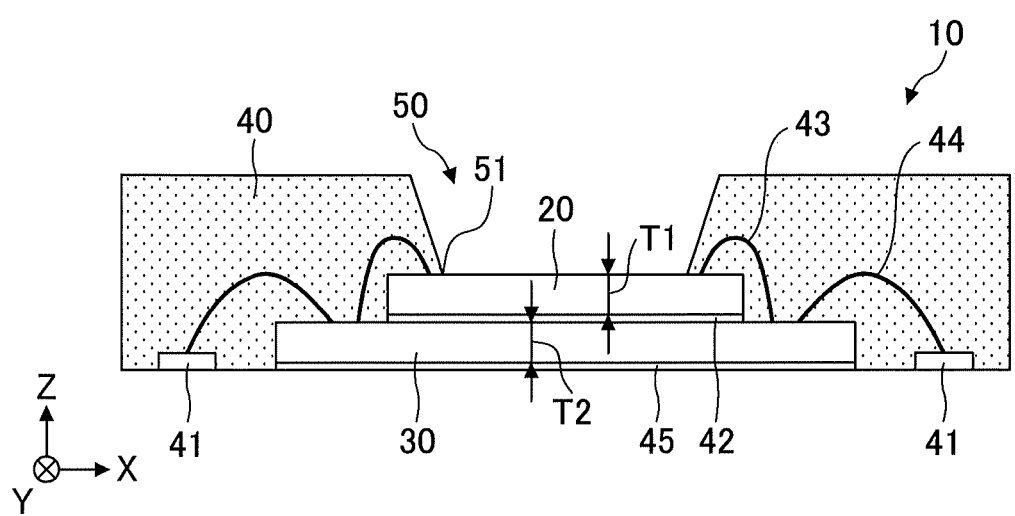
FIG. 2 is a schematic cross-sectional view of the humidity sensor taken through line A-A of FIG. 1.

FIG. 1A through FIG. 1C are diagrams illustrating a schematic configuration of the humidity sensor 10 according to the embodiment of the present invention. FIG. 1A is a plan view from above the humidity sensor 10. FIG. 1B is a bottom view from below the humidity sensor 10. FIG. 1C is a side view from the side of the humidity sensor 10. Further, FIG. 2 is a schematic cross-sectional view of the humidity sensor 10 taken through line A-A of FIG. 1A.

The humidity sensor 10 has an approximate rectangular shape in planar view, in which one pair of opposite sides extend parallel to the X-direction and the other pair of opposite sides extend parallel to the Y-direction. The X-direction and the Y-direction are perpendicular to each other. The humidity sensor 10 has a thickness in the Z-direction that is perpendicular to both the X-direction and the Y-direction. The shape of the humidity sensor 10 in planar view is not limited to the rectangular shape, and may a circular shape, an oval shape, or a polygonal shape.

The humidity sensor 10 includes a sensor chip 20, which is an example of a first semiconductor chip, an application-specific integrated circuit (ASIC) chip 30, which is an example of a second semiconductor chip, a molded resin 40, and a plurality of lead terminals 41.

The sensor chip 20 is stacked on the ASIC chip 30 via a first die attach film (DAF) 42. In other words, the sensor chip 20 and the ASIC chip 30 have a stacked structure.

The sensor chip 20 and the ASIC chip 30 are electrically connected via a plurality of first bonding wires 43. The ASIC chip 30 and the plurality of leads 41 are electrically connected via a plurality of second bonding wires 44.

The sensor chip 20 and the ASIC chip 30 stacked as descried above, the plurality of first bonding wires 43, the plurality of second bonding wires 44, and the plurality of lead terminals 41 are sealed by the molded resin 40 to form a package. Such a packaging technique is referred to as a plating lead package (PLP) method.

As will be described in more detail below, a second DAF 45, used to form the package with the PLP method, remains on the lower surface of the ASIC chip 30. The second DAF 45 functions to electrically insulate the lower surface of the ASIC chip 30. The second DAF 45 and the plurality of lead terminals 41 are exposed on the lower surface of the humidity sensor 10.

Each of the lead terminals 41 is formed of nickel or copper, for example. The first DAF 42 and the second DAF 45 are each formed of an insulating material that is a mixture of a resin, silica, and the like. The molded resin 40 is a black resin having light-blocking properties, such as an epoxy resin including a mixture of carbon black, silica, or the like.

An opening 50 is formed on the upper surface side of the humidity sensor 10, and a part of the sensor chip 20 is exposed from the molded resin 40 through the opening 50. For example, the opening 50 may have a tapered wall, such that the area of the opening decreases toward the lower surface of the humidity sensor 10. The lowermost part of the opening 50, from which the sensor chip 20 is exposed, is referred to as an effective opening 51.

When the opening 50 is formed, the molded resin 40 is applied while pressing a mold against the sensor chip 20. At this time, the pressing force against the sensor chip 20 and the ASIC chip 30 may cause damage such as cracking of the chip. In order to prevent such damage, the thickness T1 of the sensor chip 20 and the thickness T2 of the ASIC chip 30 are preferably 200 μm or more.

Figure 3:
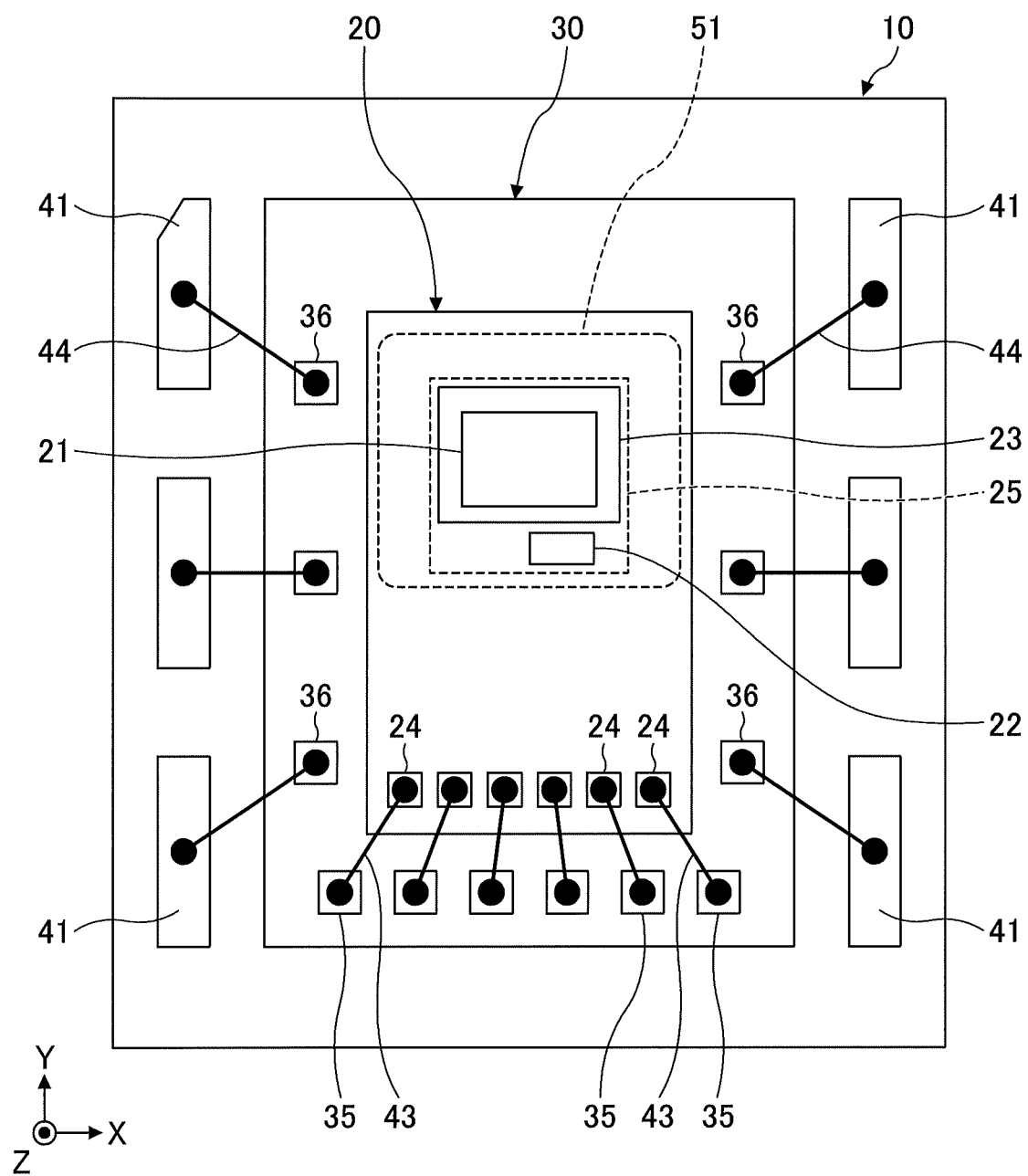
FIG. 3 is a plan view of the humidity sensor in which a molded resin is not depicted.

FIG. 3 is a plan view of the humidity sensor 10 in which the molded resin 40 is not depicted. As illustrated in FIG. 3, the sensor chip 20 and the ASIC chip 30 each have an approximately rectangular shape in planar view. The sensor chip 20 is smaller than the ASIC chip 30, and the sensor chip 20 is stacked on the surface of the ASIC chip 30 via the first DAF 42.

The sensor chip 20 includes a humidity detecting unit 21, a temperature detecting unit 22, and a heating unit 23 within the effective opening 51. The heating unit 23 is disposed on the lower surface of the humidity detecting unit 21 to cover a region where the humidity detecting unit 21 is formed. In other words, the area of heating unit 23 is larger than the area of the humidity detecting unit 21 in the planar view. Accordingly, the molded resin 40, which is an example of a sealing member, seals the sensor chip 20, with the humidity detecting unit 21 and the temperature detecting unit 22 being exposed.

Further, a plurality of bonding pads (hereinafter simply referred to as "pads") 24 are formed at the end portion of the sensor chip 20. In the present embodiment, six pads 24 are formed. The pads 24 may be formed of aluminum or an aluminum silicon (AlSi) alloy, for example.

Figure 16:
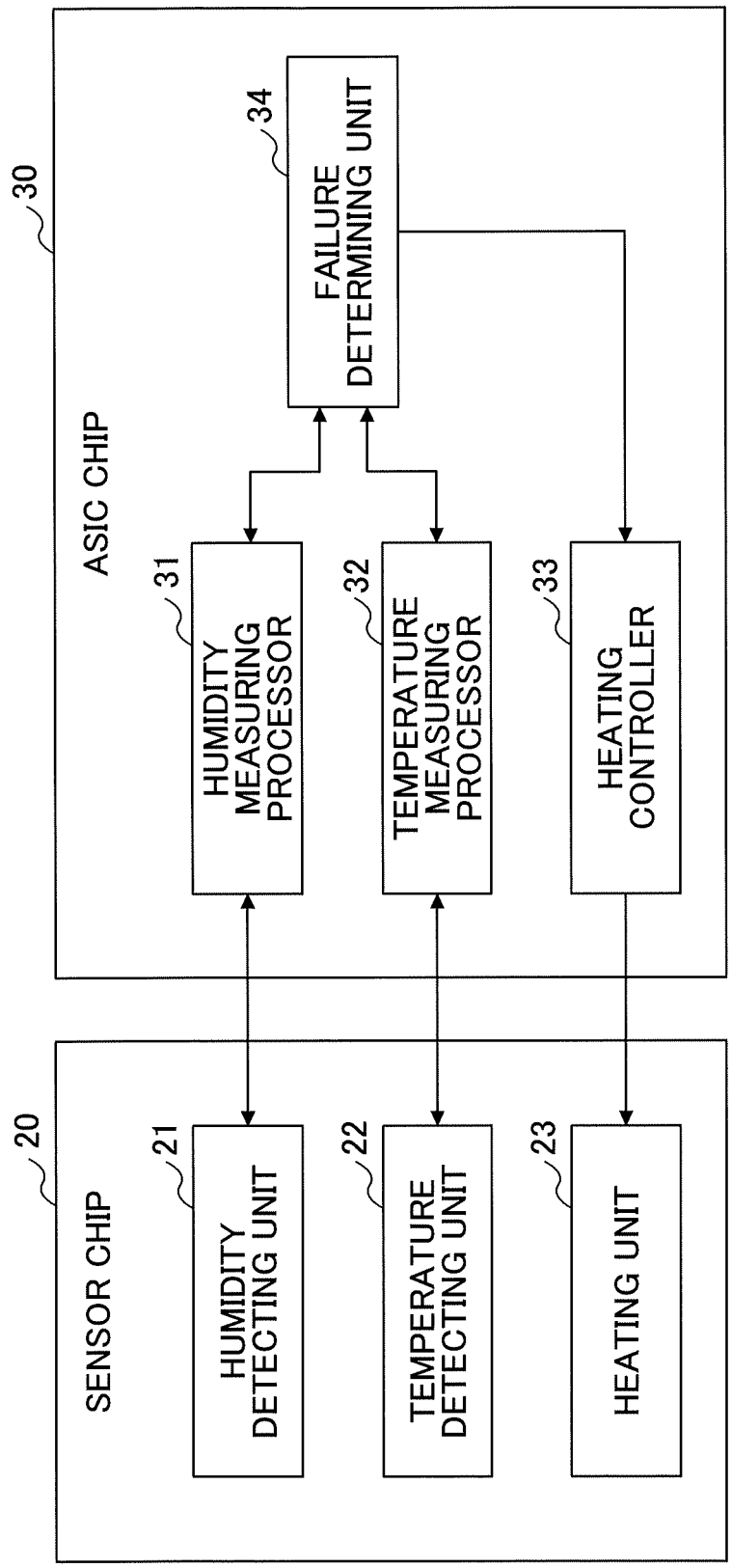
FIG. 16 is a block diagram illustrating a configuration of an ASIC chip.

The ASIC chip 30 is a semiconductor chip for signal processing and control. As illustrated in FIG. 16, the ASIC chip 30 includes a humidity measuring processor 31, a temperature measuring processor 32, a heating controller 33, and a failure determining unit 34, which will be described below.

Further, a plurality of first pads 35 and a plurality of second pads 36 are provided in an area on the surface of the ASIC chip 30 that is not covered by the sensor chip 20. The first pads 35 and the second pads 36 may be formed of aluminum or an aluminum silicon (AlSi) alloy, for example.

The first pads 35 are connected to the respective pads 24 of the sensor chip 20 via the first bonding wires 43. The second pads 36 are connected to the respective lead terminals 41 via the second bonding wires 44. The lead terminals 41 are disposed at the periphery of the ASIC chip 30.

In the manufacturing process of the humidity sensor 10, the mounting position of the ASIC chip 30 is determined based on the lead terminals 41. The mounting position of the sensor chip 20 on the ASIC chip 30 is determined based on either the position of the ASIC chip 30 or the lead terminals 41. The opening 50 is formed by, for example, transfer molding using the mold, and the position of the mold is determined based on the lead terminals 41.

A reference numeral "25" illustrated in FIG. 3 indicates a formation allowable region where the formation of the humidity detecting unit 21 and the temperature detecting unit 22 on the sensor chip 20 is allowed. The formation allowable region 25 is set within the opening 50, thereby allowing the formation allowable region 25 to be securely exposed through the opening 50 even if the positions of the ASIC chip 30, the sensor chip 20, and the mold are displaced during the manufacturing process. As long as the humidity detecting unit 21 and the temperature detecting unit 22 are formed within the formation allowable region, the humidity detecting unit 21 and the temperature detecting unit 22 are securely exposed through the opening 50 regardless of the positional displacement.

[Configuration of Sensor Chip]

Next, a configuration of the sensor chip 20 will be described.

Figure 4:
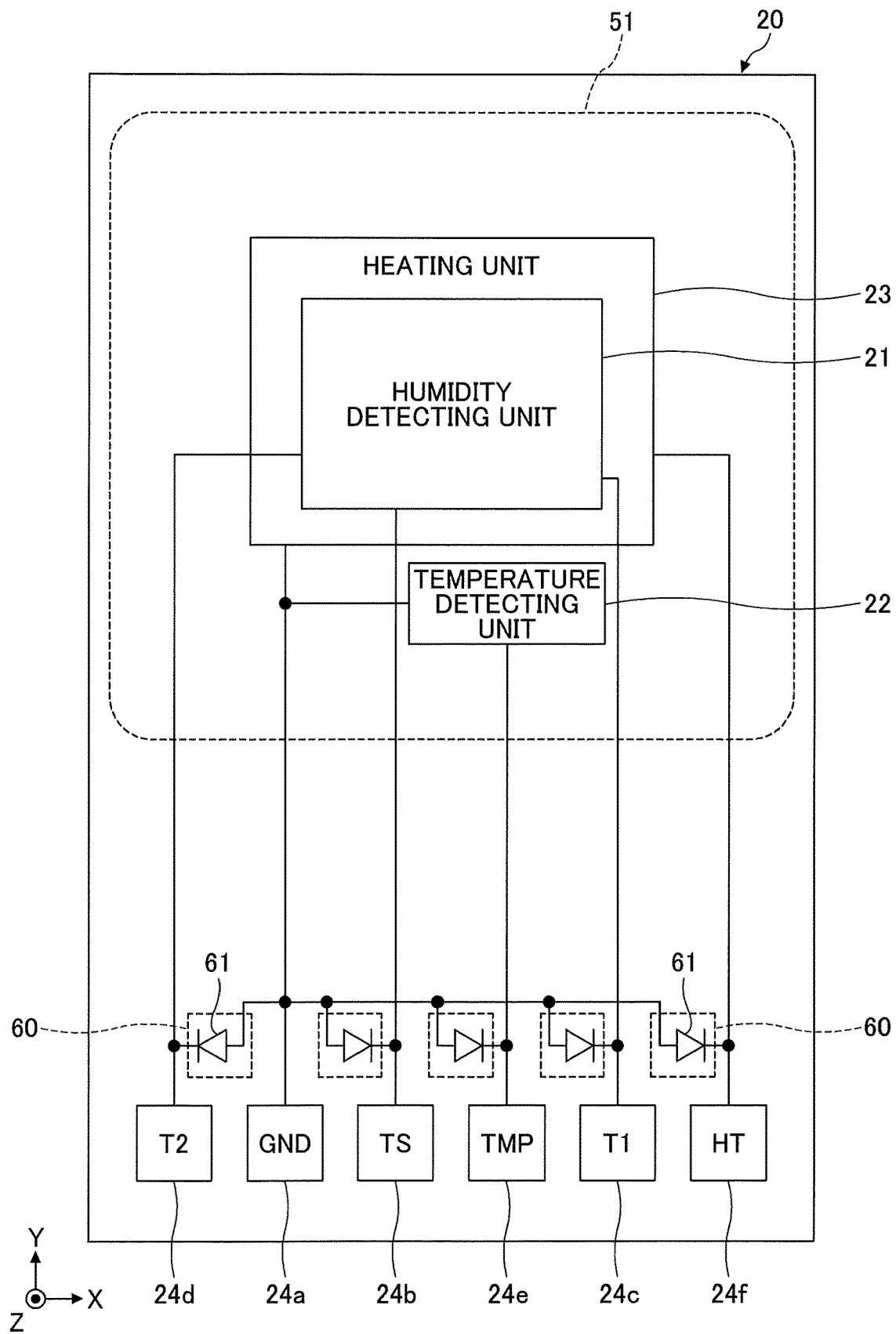
FIG. 4 is a plan view schematically illustrating a configuration of a sensor chip.

FIG. 4 is a plan view schematically illustrating the configuration of the sensor chip 20. The above-described pads 24 are terminals that may be used to apply voltages from the outside and detect potentials. In FIG. 4, the plurality of pads 24 are distinguishably illustrated as pads 24a through 24f. If the pads 24a through 24f are not required to be distinguished, the pads 24a through 24f are simply referred to as "pads 24".

The pad 24a functions as a ground electrode terminal (GND) grounded to the ground potential. The pad 24a is electrically connected to 22 various units such as the temperature detecting unit and the heating unit 23 via wiring and a substrate. Further, the pad 24a is electrically connected to a p-type semiconductor substrate 70 (see FIG. 9) constituting the sensor chip 20.

The pad 24b is a signal terminal (TS) electrically connected to a lower electrode 83 of the humidity detecting unit 21. The pad 24c is a first driving terminal (T1) electrically connected to an upper electrode 84 of the humidity detecting unit 21. The pad 24d is a second driving terminal (T2) electrically connected to a reference electrode 82 (see FIG. 9) of the humidity detecting unit 21.

The pad 24e is a temperature detecting terminal (TMP) electrically connected to the temperature detecting unit 22. The pad 24e is used to obtain a temperature detection signal. The pad 24f is a heating terminal (HT) electrically connected to the heating unit 23. The pad 24f is used to supply a driving voltage that drives the heating unit 23.

Further, electrostatic discharge (ESD) protection circuits 60 are connected to the respective pads 24b through 24f, except for the pad 24a. Each of the ESD protection circuits 60 is electrically connected between the pad 24a and a corresponding pad of the pads 24b through 24f. The pad 24a functions as the ground electrode terminal and the pads 24b through 24f are used as input terminals or output terminals. In the present embodiment, each of the ESD protection circuits 60 includes one diode 61. The anode side of the diode 61 is connected to the pad 24a, and the cathode side of the diode 61 is connected to a corresponding pad of the pads 24b through 24f.

The ESD protection circuits 60 are preferably arranged near the pads 24b through 24f, so as to be separated as much as possible from the effective opening 51. Because the ESD protection circuits 60 are covered by the molded resin 40, an unnecessary electric current would not be produced by a photoelectric effect.

[Configuration of ESD Protection Circuit]

Next, a configuration of an ESD protection circuit 60 will be described.

Figure 5:
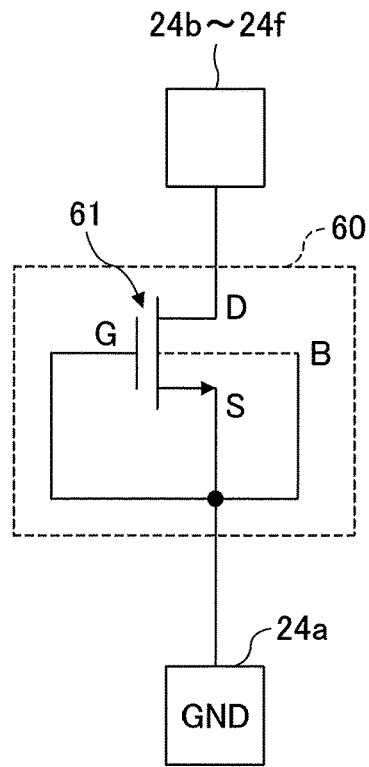
FIG. 5 is a circuit diagram illustrating a configuration of an ESD protection circuit.

FIG. 5 is a circuit diagram illustrating the configuration of the ESD protection circuit 60. As illustrated in FIG. 5, a diode 61 of the ESD protection circuit 60 is formed by an N-channel metal-oxide-semiconductor (MOS) transistor (hereinafter referred to as an NMOS transistor). More specifically, the diode 61 is formed by the NMOS transistor having a source, a gate, and a back gate that are short-circuited (that is, diode-connected). The short-circuited part of the NMOS transistor functions as an anode of the diode 61, and a drain of the NMOS transistor functions as a cathode of the diode 61.

Figure 6:
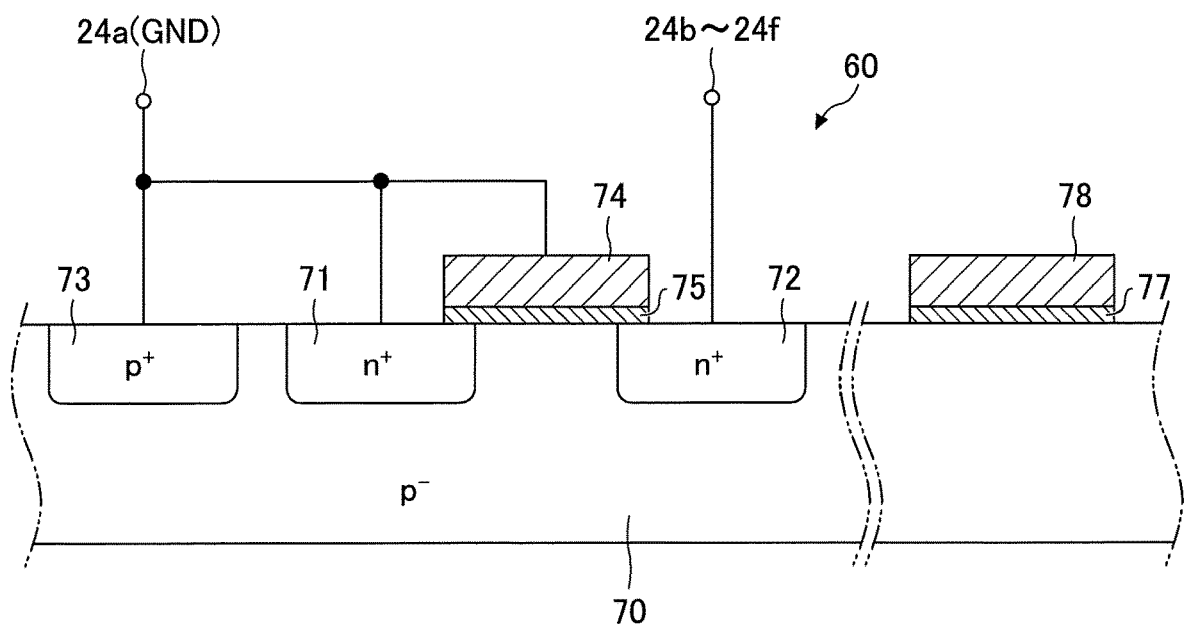
FIG. 6 is a diagram illustrating a layer structure of an NMOS transistor forming the ESD protection circuit.

FIG. 6 is a diagram illustrating a layer structure of the NMOS transistor forming the ESD protection circuit 60. The NMOS transistor illustrated in FIG. 6 includes a p-type semiconductor substrate 70, two n-type diffusion layers 71 and 72 formed in the surface layer of the p-type semiconductor substrate 70, a contact layer 73, and a gate electrode 74. The gate electrode 74 is formed on the surface of the p-type semiconductor substrate 70 via a gate insulating film 75. The gate electrode 74 is disposed between the two n-type diffusion layers 71 and 72.

For example, the n-type diffusion layer 71 functions as the source, and the n-type diffusion layer 72 functions as the drain. The contact layer 73 is a low-resistance layer (p-type diffusion layer) for making an electrical connection to the p-type semiconductor substrate 70, which functions as the back gate. The n-type diffusion layer 71, the gate electrode 74, and the contact layer 73 are connected in common and short-circuited. The short-circuited part functions as the anode, and the n-type diffusion layer 72 functions as the cathode.

The p-type semiconductor substrate 70 may be a p-type silicon substrate. The gate electrode 74 may be formed of polycrystalline silicon (polysilicon). The gate insulating film 75 may be formed of an oxide film such as silicon dioxide.

Further, a dummy pattern 78 is formed in predetermined region on the p-type semiconductor substrate 70 via an insulating film 77. The insulating film 77 is formed by the same manufacturing process as the gate insulating film 75, is formed of the same material as the gate insulating film 75, and has approximately the same thickness as the gate insulating film 75.

The dummy pattern 78 is an electrically conductive film that is formed by the same manufacturing process as the gate electrode 74, is formed of the same material as the gate electrode 74, and has approximately the same thickness as the gate electrode 74. The gate electrode 74 and the dummy pattern 78 is formed by photolithography and etching. A region where the dummy pattern 78 is formed will be described below.

[Configuration of Humidity Detecting Unit]

Next, a configuration of the humidity detecting unit 21 will be described.

Figure 7:
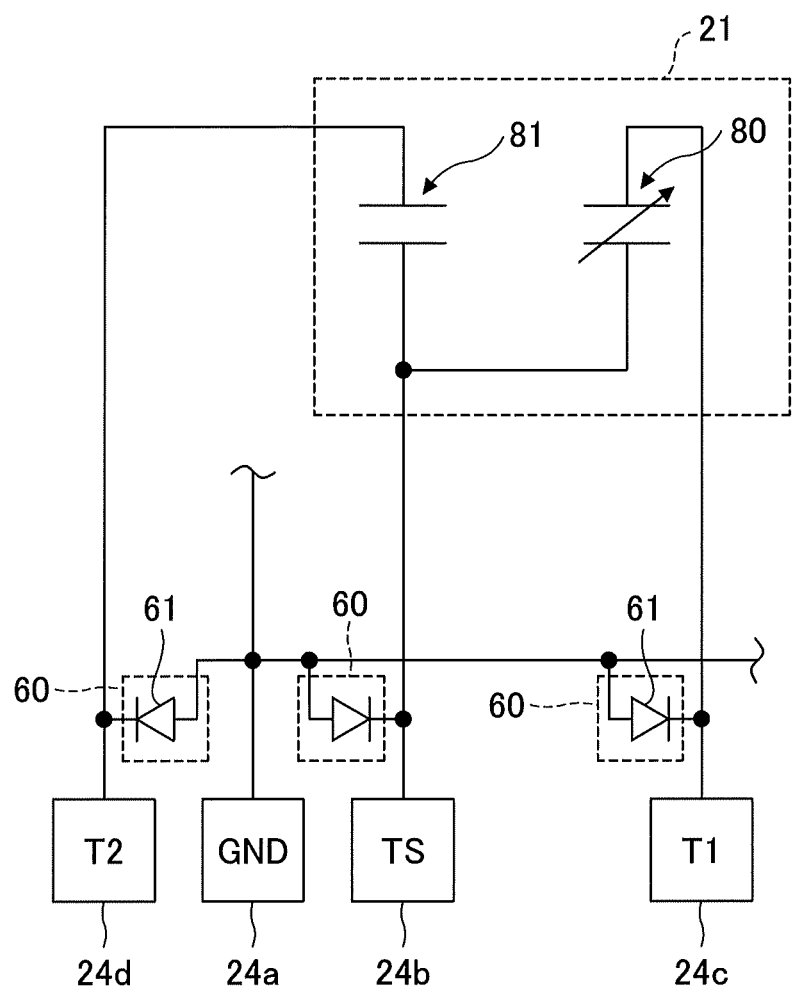
FIG. 7 is a circuit diagram illustrating a configuration of a humidity detecting unit.

FIG. 7 is a circuit diagram illustrating the configuration of the humidity detecting unit 21. As illustrated in FIG. 7, the humidity detecting unit 21 includes a humidity detecting capacitor 80 and a reference capacitor 81.

In the humidity detecting unit 21, one electrode of the humidity detecting capacitor 80 is the lower electrode 83 that is electrically connected to the pad 24b (signal terminal TS). The other electrode of the humidity detecting capacitor 80 is the upper electrode 84 that is electrically connected to the pad 24c (first driving terminal T1). One electrode of the reference capacitor 81 is the lower electrode 83 that is used in common between the humidity detecting capacitor 80 and the reference capacitor 81. The other electrode of the reference capacitor 81 is the reference electrode 82 that is electrically connected to the pad 24d (second driving terminal T2).

A humidity sensing film 86, which will be described below, is provided between the electrodes of the humidity detecting capacitor 80. The humidity sensing film 86 is formed of a polymeric material such as polyimide that adsorbs moisture in the air and whose dielectric constant varies in accordance with the amount of adsorbed moisture. Accordingly, the electrostatic capacitance of the humidity detecting capacitor 80 varies in accordance with the amount of moisture adsorbed by the humidity sensing film 86.

A second insulating film 111 (see FIG. 9), which will be described below, is provided between the electrodes of the reference capacitor 81. The second insulating film 111 is formed of an insulating material such as silicon dioxide ($SiO_2$) that does not adsorb moisture. Accordingly, the electrostatic capacitance of the reference capacitor 81 does not vary or only slightly varies.

The amount of moisture included in the humidity sensing film 86 corresponds to ambient humidity of the humidity sensor 10. Thus, relative humidity can be measured by detecting a difference in electrostatic capacitance between the humidity detecting capacitor 80 and the reference capacitor 81. The measurement of relative humidity is performed by the humidity measuring processor 31 (see FIG. 16) included in the ASIC chip 30.

[Configuration of Temperature Detecting Unit]

Next, a configuration of the temperature detecting unit 22 will be described.

Figure 8:
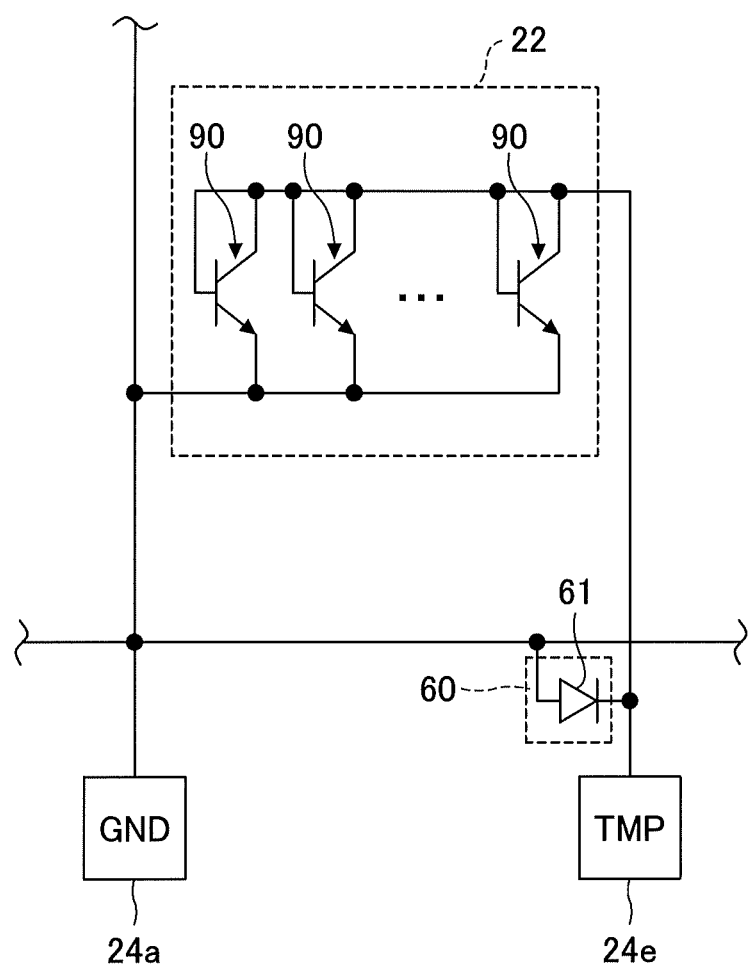
FIG. 8 is a circuit diagram illustrating a configuration of a temperature detecting unit.

FIG. 8 is a circuit diagram illustrating the configuration of the temperature detecting unit 22. The temperature detecting unit 22 is a band-gap type temperature sensor that detects the temperature by utilizing the electrical property (band cap) of the semiconductor that varies in proportion to a temperature change. For example, the temperature detecting unit 22 includes one or more of bipolar transistors, in each of which two terminals of a base, an emitter, and a collector are connected. The temperature detecting unit 22 measures the temperature by detecting the resistance between the two terminals.

As illustrated in FIG. 8, in the present embodiment, the temperature detecting unit 22 includes a plurality of (for example, eight) npn type bipolar transistors 90 connected in parallel. In each of the bipolar transistors 90, a base and a collector are connected to each other. By connecting the plurality of bipolar transistors 90 in parallel, a junction area of a p-n junction can be increased, and the ESD resistance can be thus improved.

An emitter of a bipolar transistor 90 is electrically connected to the pad 24a, which functions as the ground electrode terminal. The base and the collector of the bipolar transistor 90 are connected to the pad 24e, which functions as the temperature detecting terminal.

The temperature is measured by the temperature measuring processor 32 (see FIG. 16) included in the ASIC chip 30, based on the potential of the pad 24e.

[Device Structure of Sensor Chip]

Next, a device structure of the sensor chip 20 will be described.

Figure 9:
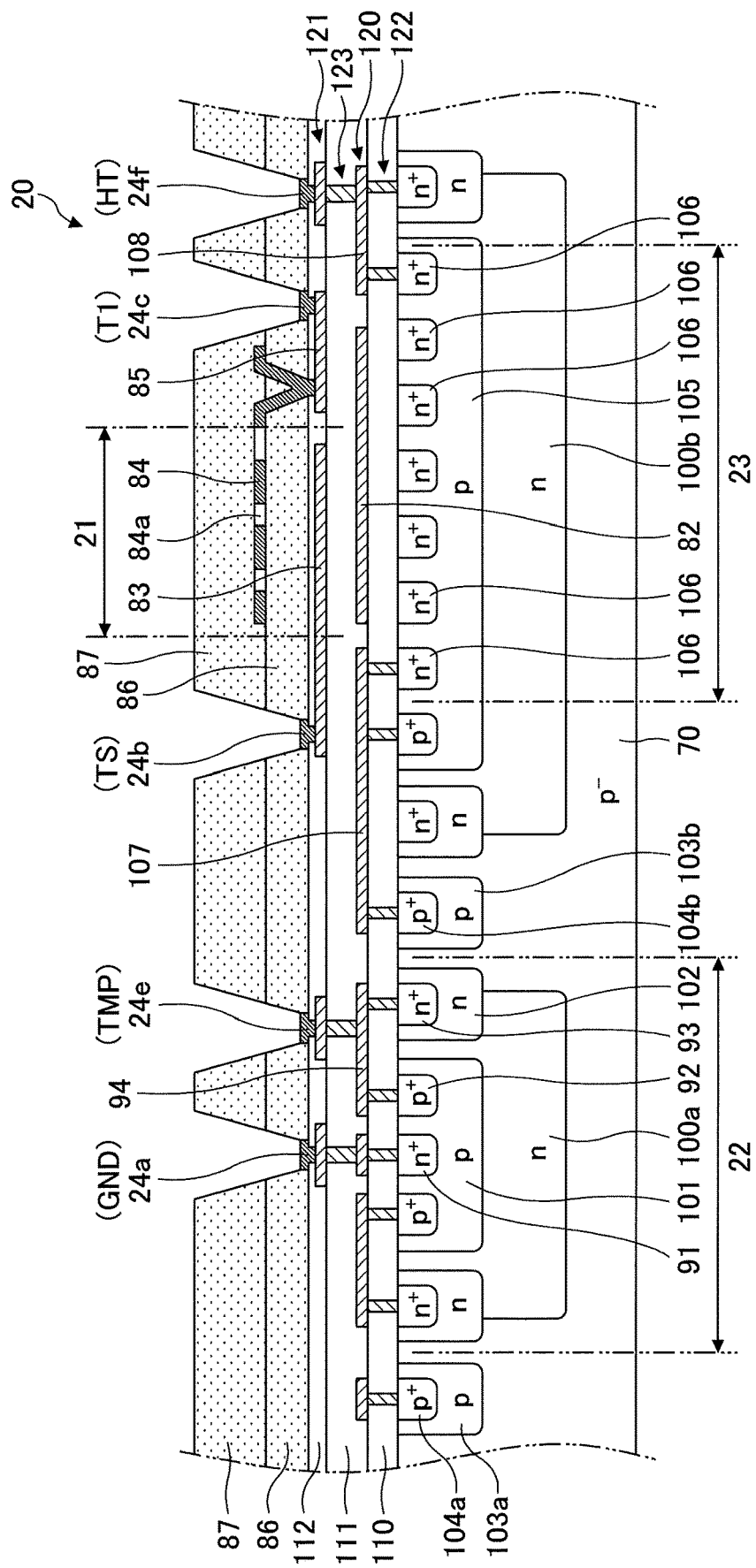
FIG. 9 is a schematic cross-sectional view of a device structure of a sensor chip.

FIG. 9 is a schematic cross-sectional view of the device structure of the sensor chip 20. In order to facilitate understanding of the structure, the pads 24a, 24b, 24c, and 24e are drawn in the same cross section as the humidity detecting unit 21, the temperature detecting unit 22, and the heating unit 23 in FIG. 9; however, this does not mean that the pads 24 are actually located in the same cross section as the humidity detecting unit 21, the temperature detecting unit 22, and the heating unit 23. Further, in order to facilitate the understanding of the structure, the humidity detecting unit 21, the temperature detecting unit 22, and the heating unit 23 are simplified, and the positional relationship of the units illustrated in FIG. 9 is different from the actual positional relationship.

As illustrated in FIG. 9, the sensor chip 20 includes the above-described p-type semiconductor substrate 70. A first deep n-well 100a and a second deep n-well 100b are formed in the p-type semiconductor substrate 70. The temperature detecting unit 22 is formed in the first deep n-well 100a, and the heating unit 23 is formed in the second deep n-well 100b.

P-wells 103a and 103b are formed in the surface layer of the p-type semiconductor substrate 70 where neither the first deep n-well 100a nor the second deep n-well 100b is formed. Contact layers 104a and 104b, which are p-type diffusion regions, are formed in the surface layers of the p-wells 103a and 103b, respectively. The contact layers 104a and 104b are low-resistance layers (p-type diffusion layers) for making an electrical connection between the p-type semiconductor substrate 70 and predetermined wiring layers formed on the p-type semiconductor substrate 70.

A p-well 101 and an n-well 102 are formed in the surface layer of the first deep n-well 100a. An n-type diffusion layer 91 and a p-type diffusion layer 92 are formed in the surface layer of the p-well 101. An n-type diffusion layer 93 is formed in the surface layer of the n-well 102. The n-type diffusion layer 91, the p-type diffusion layer 92, and the n-type diffusion layer 93 form the above-described npn-type bipolar transistor 90, and function as an emitter, a base, and a collector, respectively.

A p-well 105 is formed in the surface layer of the second deep n-well 100b. One or more n-type diffusion layers 106 are formed in the surface layer of the p-well 105. In the present embodiment, a plurality of n-type diffusion layers 106 are formed. For example, each of the n-type diffusion layers 106 extends in a direction perpendicular to the paper surface of FIG. 9, and forms a one-dimensional lattice as a whole (see FIG. 11). Each of the n-type diffusion layers 106 has a predetermined resistance (for example, a sheet resistance of approximately 3Ω), and functions as a resistor that generates heat when a current flows through the resistor. In other words, the n-type diffusion layers 106 form the above-described heating unit 23.

Each layer of the p-type semiconductor substrate 70 is formed by an existing semiconductor manufacturing process (a CMOS process). Accordingly, the n-type diffusion layers 106, which function as the resistors, are formed by the same manufacturing process as the n-type diffusion layers 91 and 93, included in a part of the temperature detecting unit 22. The n-type diffusion layers 106, 91, and 93 are formed simultaneously by an ion implantation process in which n-type impurities (such as phosphorus) are implanted into the p-type semiconductor substrate 70. In other words, the n-type diffusion layers 106, functioning as the resistors, and the n-type diffusion layers 91 and 93, included in the part of the temperature detecting unit 22, have the same depth from the surface of the p-type semiconductor substrate 70. In addition, the n-type diffusion layers 106 and the p-type diffusion layer 92 included in a part of the temperature detecting unit 22 may have the same depth from the surface of the p-type semiconductor substrate 70.

Further, instead of the ion implantation process, the n-type diffusion layers 106, 91, and 93 may also be formed by a thermal diffusion process in which impurities are added to the p-type semiconductor substrate 70 by applying thermal processing.

In addition, the above-described n-type diffusion layers 71 and 72 of the ESD protection circuit 60 may also be formed by the same manufacturing process (ion implantation process or thermal diffusion process) as the n-type diffusion layers 106, 91, and 93. The contact layer 73 is formed by the same manufacturing process (ion implantation process or thermal diffusion process) as the p-type diffusion layer 92 and the contact layers 104a and 104b.

Other layers of the p-type semiconductor substrate 70 mainly function as contact layers, and thus a description thereof will be omitted.

A first insulating film 110, the second insulating film 111, and a third insulating layer 112 are stacked in this order on the surface of the p-type semiconductor substrate 70. The insulating films 110, 111, and 112 are formed of an insulating material such as silicon dioxide ($SiO_2$) or silicon nitride (SiN).

A first wiring layer 120 is formed on the first insulating film 110. A second wiring layer 121 is formed on the second insulating film 111. The second insulating film 111 covers the first wiring layer 120. The third insulating film 112 covers the second wiring layer 121. The first wiring layer 120 and the second wiring layer 121 are formed of an electrically conductive material such as aluminum.

A first plug layer 122, having a plurality of first plugs for electrically connecting the first wiring layer 120 to the p-type semiconductor substrate 70, is formed in the first insulating film 110. A second plug layer 123, having a plurality of second plugs for electrically connecting the first wiring layer 120 to the second wiring layer 121, is formed in the second insulating film 111. The first plug layer 122 and the second plug layer 123 are formed of an electrically conductive material such as tungsten.

For example, wiring 94 for connecting the base to the collector of the above-described bipolar transistor 90 is formed by the first wiring layer 120, and is electrically connected to the p-type diffusion layer 92 and the n-type diffusion layer 93 via the first plug layer 122. In addition, the wiring 94 is electrically connected to the pad 24e, which functions as the temperature detecting terminal, via the second plug layer 123 and the second wiring layer 121. Further, the n-type diffusion layer 91, which functions as the emitter of the bipolar transistor 90, is electrically connected to the pad 24a, which functions as the ground electrode terminal, via the first plug layer 122, the first wiring layer 120, and the second wiring layer 121.

Wiring 107 for grounding one end of the heating unit 23 to the ground potential is formed by the first wiring layer 120, and is electrically connected to an n-type diffusion layer 106 and a contact layer 104b via the first plug layer 122. In addition, wiring 108 for electrically connecting the other end of the heating unit 23 to the pad 24f, which functions as the heating terminal, is electrically connected to an n-type diffusion layer 106 via the first plug layer 122, and is electrically connected to the pad 24f via the second plug layer 123 and the second wiring layer 121. The wiring 108 is preferably wider than other wiring, in order to prevent electromigration caused by a large current flowing through the heating unit 23.

The reference electrode 82 of the reference capacitor 81 is formed by the first wiring layer 120, and is electrically connected to the pad 24d (not illustrated in FIG. 9), which functions as the second driving terminal T2, via the second plug layer 123 and the second wiring layer 121.

Further, the lower electrode 83 of the humidity detecting capacitor 80 is formed by the second wiring layer 121, and is electrically connected to the pad 24b, which functions as the signal terminal TS. Moreover, wiring 85 for electrically connecting the upper electrode 84 of the humidity detecting capacitor 80 to the pad 24c, which functions as the first driving terminal T1, is formed by the second wiring layer 121. The lower electrode 83 is formed on the second insulating film 111 on the opposite side of the reference electrode 82.

The pads 24a through 24f are formed on the third insulating layer 112, and are formed of an electrically conductive material such as aluminum (Al). The pads 24a through 24f are electrically connected to the second wiring layer 121 through the third insulating layer 112.

The humidity sensing film 86 is formed on the third insulating film 112. The humidity sensing film 86 may have a thickness of 0.5 μm to 1.5 μm, and is formed of a polymeric material that readily adsorbs and desorbs water molecules in accordance with the humidity. The humidity sensing film 86 may be a polyimide film having a thickness of 1 μm, for example. The polymeric material forming the humidity sensing film 86 is not limited to polyimide, and may be cellulose, polymethyl methacrylate (PMMA), or polyvinyl alcohol (PVA).

The upper surface of the humidity sensing film 86 is flat, and the plate-shaped upper electrode 84 is formed on the upper surface of the humidity sensing film 86. The upper electrode 84 is formed on the humidity sensing film 86 on the opposite side of the lower electrode 83. A part of the upper electrode 84 is electrically connected to the wiring 85. The upper electrode 84 is an electrically conductive layer made of aluminum and having a thickness of 200 nm, for example. The upper electrode 84 has a plurality of openings 84a that allow water molecules in the air to be efficiently adsorbed into the humidity sensing film 86.

An overcoat layer 87 is formed on the humidity sensing film 86 so as to cover the upper electrode 84. The overcoat layer 87 is made of a polymeric material. For example, the overcoat layer 87 may be made of the same material as the humidity sensing film 86. The overcoat layer 87 may have a thickness of 0.5 μm to 10 μm.

The humidity sensing film 86 and the overcoat layer 87 have openings through which the pads 24a through 24f are exposed.

As described above, the parallel-plate-type humidity detecting capacitor 80 is configured by the lower electrode 83 and the upper electrode 84. In addition, the parallel-plate-type reference capacitor 81 is configured by the lower electrode 83 and the reference electrode 82. Further, the humidity detecting capacitor 80 and the reference capacitor 81 are provided above the heating unit 23.

Accordingly, when the heating unit 23 generates heat, the humidity sensing film 86 between the lower electrode 83 and the upper electrode 84 is heated. As a result, the temperature of the humidity sensing film 86 increases, and the amount of water molecules is adsorbed in accordance with the humidity. This causes the dielectric constant of the humidity sensing film 86 to change, and the electrostatic capacitance of the humidity detecting capacitor 80 to be decreased. Further, the temperature detecting unit 22 detects an increase in temperature caused by the heating unit 23.

Figure 10:
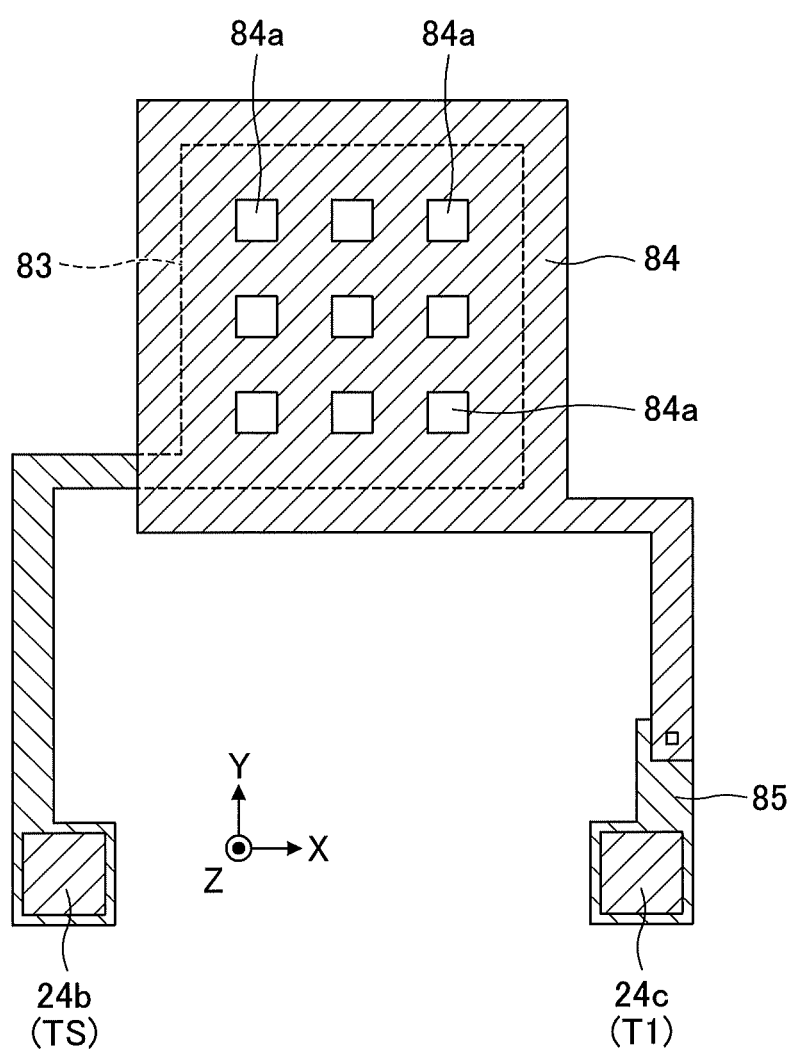
FIG. 10 is a plan view of a lower electrode and an upper electrode.

FIG. 10 is a plan view of the lower electrode 83 and the upper electrode 84. As illustrated in FIG. 10, the lower electrode 83 and the upper electrode 84 have rectangular shapes. The upper electrode 84 is formed so as to cover the lower electrode 83.

The openings 84a are preferably as small as possible. As the openings 84a become smaller, leakage of an electric field into the air can be decreased. Practically, a large number of minute openings 84a are formed. Note that the shape of each of the openings 84a is not limited to a square shape. The openings 84a may each have an elongated stripe shape or a circular shape. In addition, the openings 84a may be arranged in a staggered pattern. Preferably, the openings 84a each have a circular shape, and are arranged in a staggered pattern.

Although not illustrated in FIG. 10, the rectangular-shaped reference electrode 82 is formed below the lower electrode 83.

Figure 11:
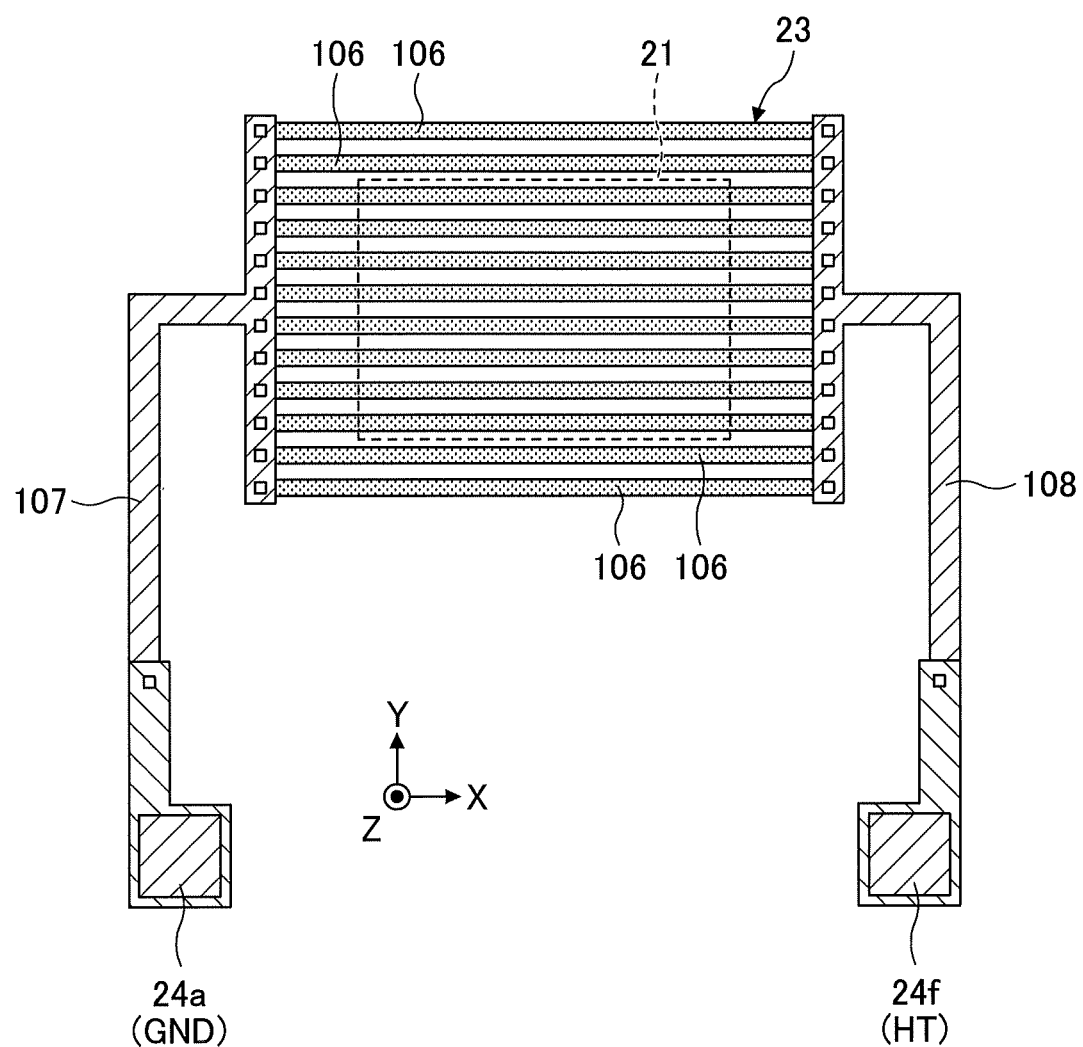
FIG. 11 is a plan view of n-type diffusion layers constituting a heating unit.

FIG. 11 is a plan view of the n-type diffusion layers 106 constituting the heating unit 23. As illustrated in FIG. 11, the n-type diffusion layers 106 has a one-dimensional lattice shape in which a plurality of elongated stripe-shaped regions are arranged in parallel. One ends of the n-type diffusion layers 106 having the one-dimensional lattice shape are connected to the above-described ground wiring 107, and the other ends of the n-type diffusion layers 106 are connected to the above-described wiring 108. The heating unit 23 is located under the humidity detecting unit 21 so as to cover the entire humidity detecting unit 21.

[Regions where Dummy Patterns are Formed]

Next, the regions where dummy patterns 78 as described above are formed will be described.

Figure 12:
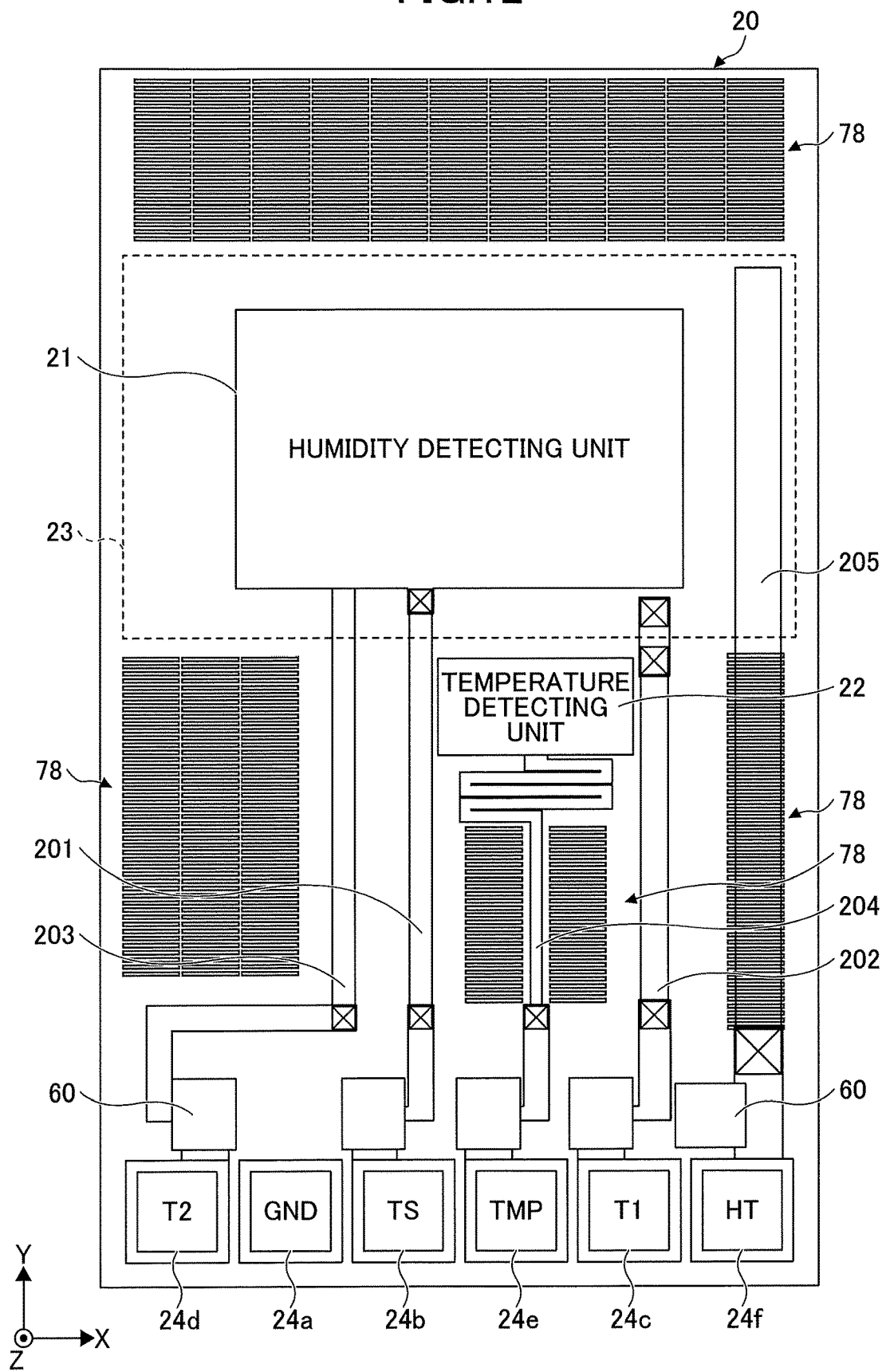
FIG. 12 is a diagram illustrating regions where dummy patterns are formed on the sensor chip.
Figure 13:
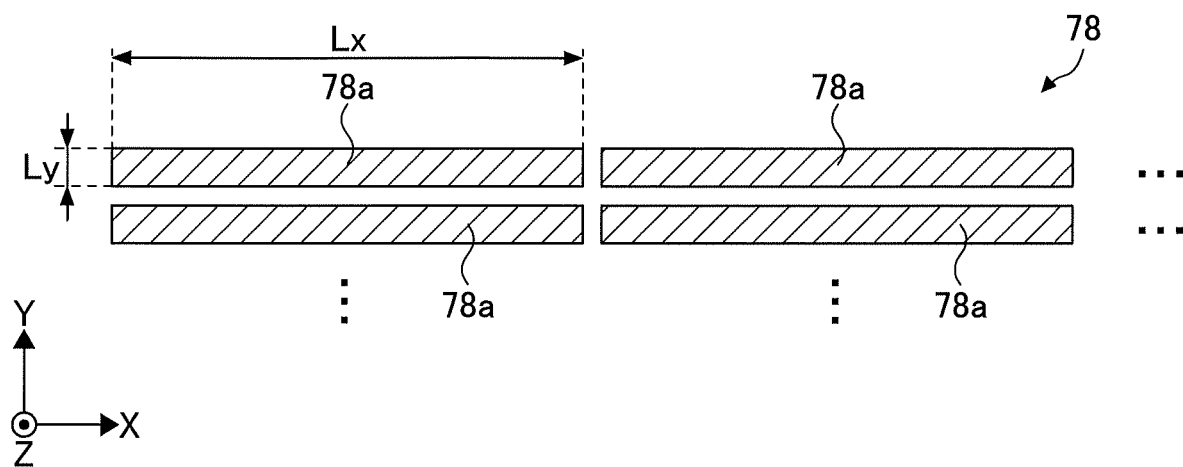
FIG. 13 is a diagram illustrating components of a dummy pattern.

FIG. 12 is a diagram illustrating regions where the dummy patterns 78 are formed on the sensor chip 20. FIG. 13 is a diagram illustrating components 78a of a dummy pattern 78.

As illustrated in FIG. 13, a dummy pattern is formed by arranging strip-shaped components 78a at predetermined intervals in the X direction and in the Y direction. For example, each of the components 78a has a rectangular shape. The length Lx may be 50 μm, and the length Ly may be 4 μm. The components 78 are arranged at intervals of, for example, 2 μm in the X direction and in the Y direction.

As illustrated in FIG. 12, the dummy patterns 78 are formed in regions other than regions where the humidity detecting unit 21, the temperature detecting unit 22, the heating unit 23, the ESD protection circuits 60, and the pads 24 are provided.

Further, the dummy patterns 78 are not formed below the signal lines 201 through 204 connected to the humidity detecting unit 21 and the temperature detecting unit 22. In this manner, it is possible to suppress parasitic capacitance, which may be added to the signal lines 201 because of the placement of the dummy patterns 78, thus reducing the drive load.

The signal lines 201 through 204 are formed by the first wiring layer 120 and the second wiring layer 121. The signal line 201 is a wire connected between the lower electrode 83 of the humidity detecting unit 21 and the pad 24. The signal line 202 is a wire connected between the upper electrode 84 of the humidity detecting unit 21 and the pad 24c. The signal line 203 is a wire connected between the reference electrode 82 of the humidity detecting unit 21 and the pads 24d. The signal line 204 is a wire connecting between the temperature detecting unit 22 and the pad 24a.

Note that, although the dummy patterns 78 are not formed below the signal lines, the dummy patterns 78 may be formed below power supply wiring and ground wiring. For example, a dummy pattern 78 is formed below power supply wiring 205 connected between the pad 24f and the heating unit 23 to supply a drive voltage to the heating unit 23.

Figure 14:
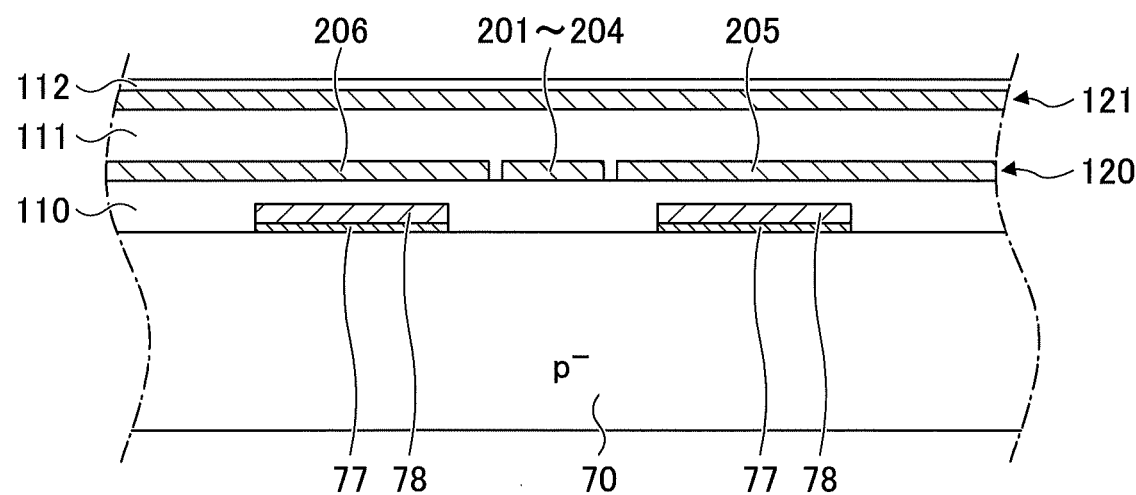
FIG. 14 is a schematic cross sectional view of dummy patterns positioned below wiring.

FIG. 14 is a schematic cross sectional view of dummy patterns 78 formed below the wiring. As described above, the dummy patterns 78 are not formed below the signal lines 201 through 204, but are formed below the power supply wiring 205.

Although not illustrated in FIG. 12, ground wiring 206, formed by the first wiring layer 120, is formed in regions other than regions where the signal lines 201 through 204 and the power supply wiring 205 are provided. The ground wiring 206 also functions to shield the surface of the p-type semiconductor substrate 70 from light. The dummy patterns 78 are mainly formed below the ground wiring 206.

[Arrangement Density]

Next, the arrangement density of gate electrodes 74 of the ESD protection circuits 60 and the dummy patterns 78, which are formed of the same material, will be described.

Figure 15:
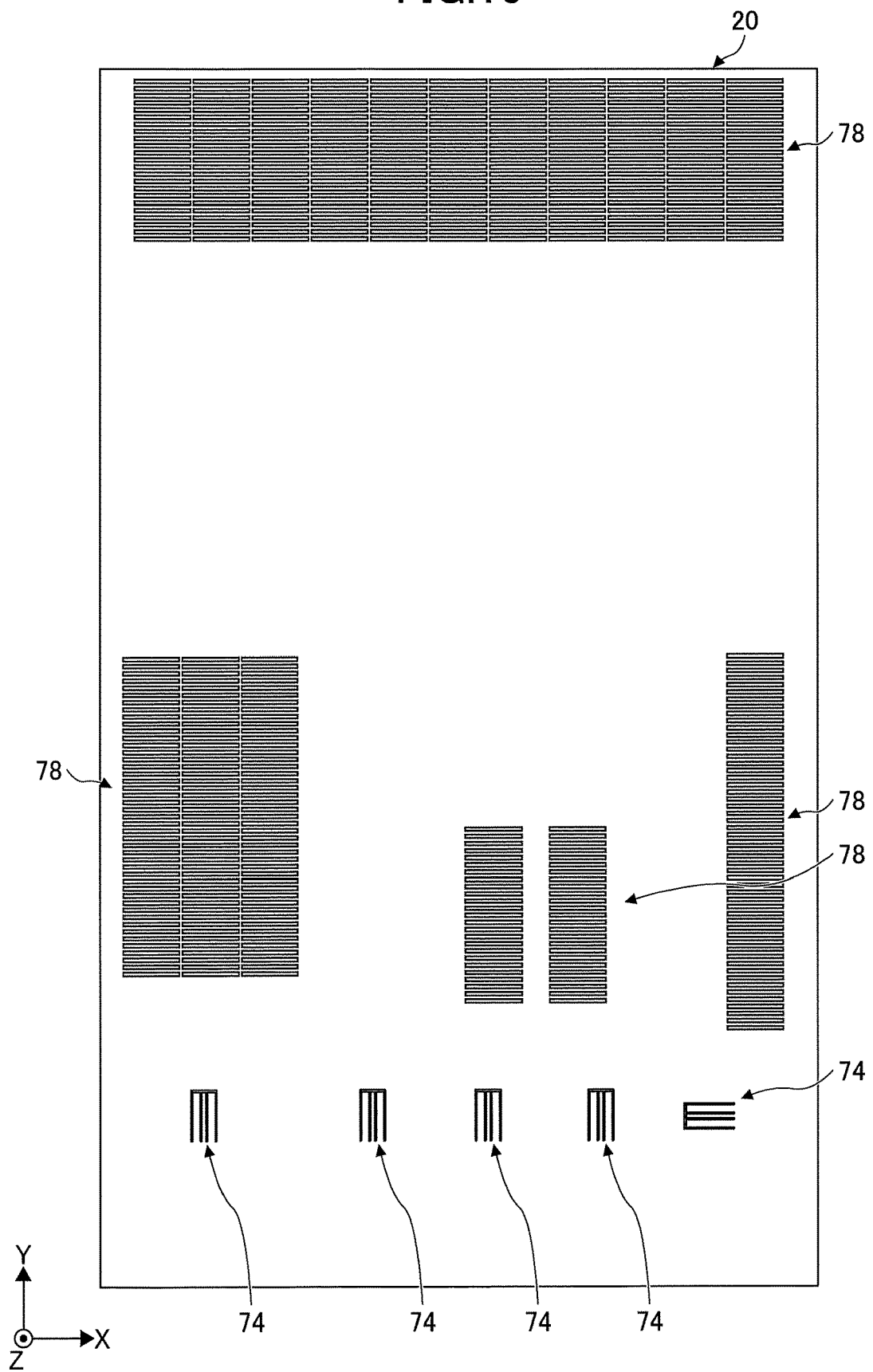
FIG. 15 is a diagram illustrating gate electrodes and the dummy patterns only.

To facilitate the description of arrangement density, FIG. 15 depicts only the gate electrodes 74 and the dummy patterns 78. In order to form the gate electrodes 74 and the dummy patterns 78, an electrically conductive film made of polycrystalline silicon is formed on the p-type semiconductor substrate 70 via an insulating film, a resist pattern is formed by photolithography, and the electrically conductive film is etched by using the resist pattern. The electrically conductive film may be etched by a dry etching method.

The ratio of the area occupied by the gate electrodes 74 and the dummy patterns 78 to the area of the sensor chip 20 is referred to as the arrangement density. In the present embodiment, the arrangement density is approximately 12%.

If the dummy patterns 78 are not formed, namely if electrically conductive films made of polycrystalline silicon are the gate electrodes 74 only, the arrangement density would be less than 1%. In this case, a process for developing a resist pattern in photolithography would become unstable. As a result, the amount of polymers in the resist pattern may be decreased, thus resulting in large side etching. Therefore, the accuracy of pattern formation by etching using a resist pattern may be decreased, and thus the yield may be reduced.

In light of the above, in the present embodiment, because the dummy patterns 78 are formed, the arrangement density is approximately 10% or more. Accordingly, a process for developing a resist pattern becomes stable, and the accuracy of pattern formation improves, thus resulting in improvement in yield. Note that a higher arrangement density is more preferable. In the present embodiment, the arrangement density is preferably 12% or more.

[Configuration of ASIC Chip]

Next, a configuration of the ASIC chip 30 will be described.

FIG. 16 is a block diagram illustrating the configuration of the ASIC chip 30. As illustrated in FIG. 16, the ASIC chip 30 includes the humidity measuring processor 31, the temperature measuring processor 32, the heating controller 33, and the failure determining unit 34.

First, a configuration of the humidity measuring processor 31 will be described.

Figure 17:
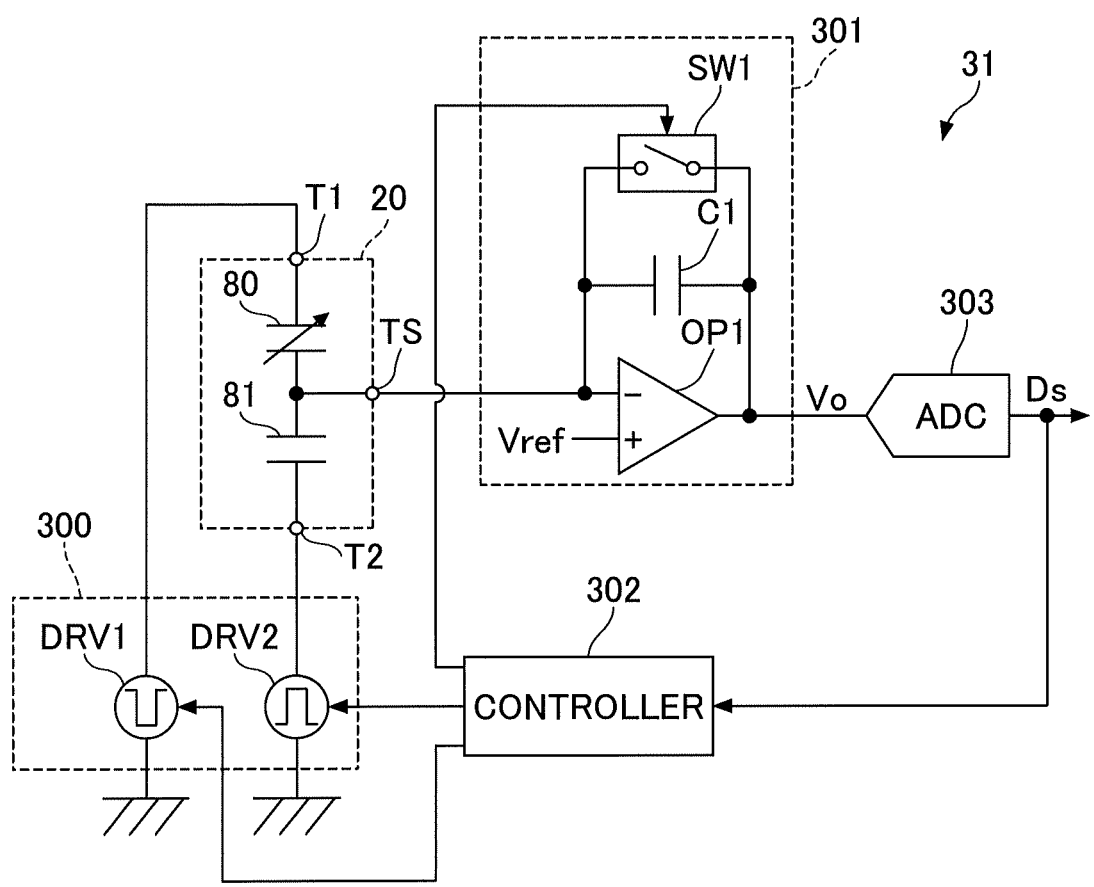
FIG. 17 is a diagram illustrating a configuration of a humidity measuring processor.

FIG. 17 is a diagram illustrating the configuration of the humidity measuring processor 31. As illustrated in FIG. 17, the humidity measuring processor 31 includes a drive unit 300, a charge amplifier 301, a controller 302, and an analog-to-digital converter (ADC) 303.

The drive unit 300 includes a first drive circuit DRV1 and a second drive circuit DRV2. The charge amplifier 301 serves as a charge-to-voltage converter (CV converter) that includes a capacitor C1, an operational amplifier OP1, and a switch circuit SW1.

The first drive circuit DRV1 applies a first drive signal, which is a square wave alternating current (AC) drive signal, to the first driving terminal T1 of the sensor chip 20, as controlled by the controller 302. The second drive circuit DRV2 applies a second drive signal to the second driving terminal T2 of the sensor chip 20, as controlled by the controller 302. The second drive signal is a square wave AC drive signal, and is in an opposite phase to the first drive signal. A high level of the first drive signal and the second drive signal is equal to, for example, the power supply voltage VDD, and a low level is equal to, for example, the ground potential GND.

The first drive signal and the second drive signal are in opposite phases. Namely, if the first drive signal is at the high level, the second drive signal is at the low level. If the first drive signal is at the low level, the second drive signal is at low high level.

On end of the capacitor C1 is connected to the signal terminal TS of the sensor chip 20, and the other end of the capacitor C1 is connected to the output of the operational amplifier OP1.

An inverting input terminal of the operational amplifier OP1 is connected to the signal terminal TS, and a noninverting input terminal of the operational amplifier OP1 is connected to a reference voltage Vref. The reference voltage Vref may be an intermediate value between the high level and the low level of the first and second drive signals.

Because the voltage gain of the operational amplifier OP1 is very large, the voltage of the signal terminal TS is approximately equal to the reference voltage Vref. In addition, the input impedance of the inverting input terminal of the operational amplifier OP1 is very high. Thus, almost no current flows into the inverting input terminal. The operational amplifier OP1 amplifies a difference between the voltage of the signal terminal TS and the reference voltage Vref, and outputs the amplified voltage Vo.

The switch circuit SW1 is a circuit that discharges electric charge stored in the capacitor C1, and is connected in parallel to the capacitor C1. The switch circuit SW1 is turned on or off, as controlled by the controller 304.

The ADC 303 converts a voltage Vo output from the operational amplifier OP1 into a digital signal Ds, as controlled by the controller 302.

The controller 302 controls the units included in the ASIC chip 30. The controller 302 causes the drive unit 300 to generate the drive signals, the switch circuit SW1 to discharge electric charge stored in the capacitor C1, and the ADC 303 to perform analog-to-digital conversion, based on a predetermined measurement sequence.

Figure 18:
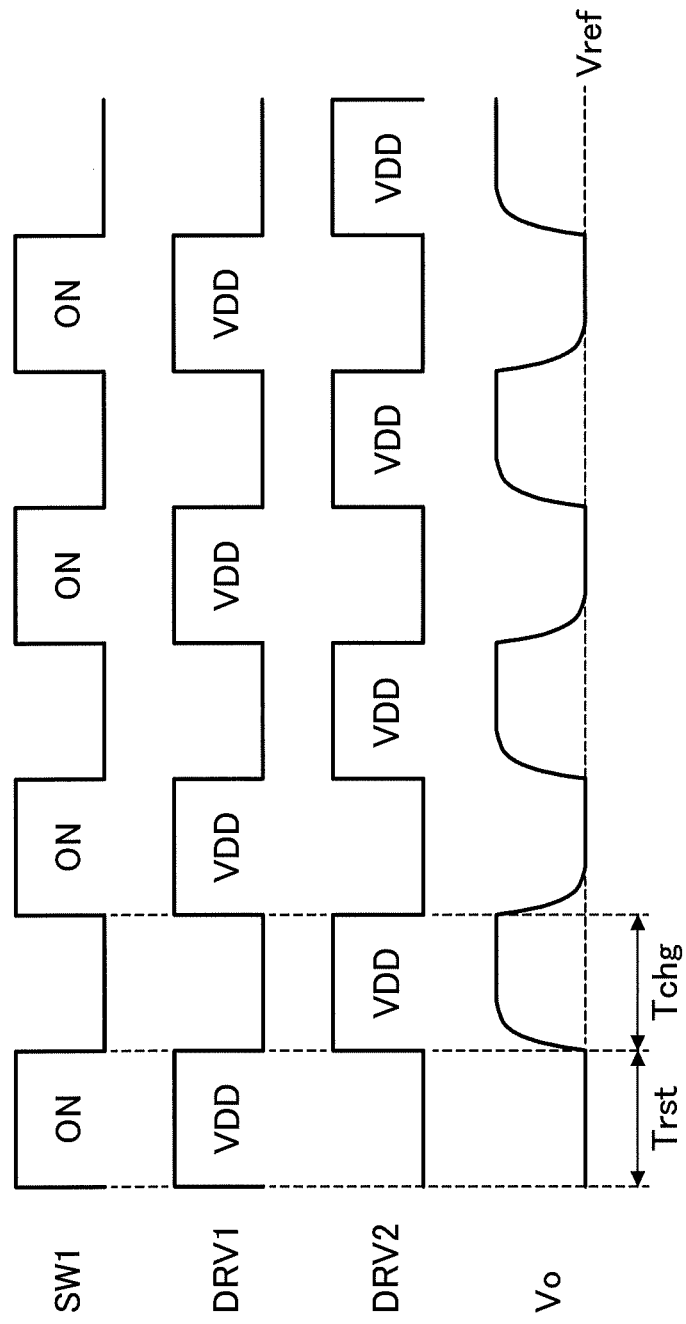
FIG. 18 is a timing chart illustrating a measurement sequence.

FIG. 18 is a timing chart illustrating the measurement sequence. In the measurement sequence, the controller 302 controls the units to repeat a reset period of time Trst and an electric charge transfer period of time Tchg. In the reset period of time Trst, the controller 302 causes the switch circuit SW1 to be turned on and electric charge stored in the capacitor C1 to be discharged, while also setting the first drive signal at the high level and the second drive signal at the low level. In the electric charge transfer period of time Tchg, the controller 302 causes the switch circuit SW1 to be turned off and the capacitor C1 to be ready to be charged, while also setting the first drive signal at the low level and the second drive signal at the high level.

Accordingly, in the electric charge transfer period of time Tchg, the voltage Vo expressed by the following formula (1) is output from the charge amplifier 301.

$$Vo = VDD \cdot (Cs - Cr)/C1 + Vref \quad (1)$$

Cs represents the electrostatic capacitance of the humidity detecting capacitor 80 and Cr represents the electrostatic capacitance of the reference capacitor 81.

The controller 30 performs a humidity calculation process by using the digital signal Ds, output from the ADC 303, to calculate relative humidity (% Rh).

The temperature measuring processor 32 detects the potential of the pad 24e, which functions as the temperature detecting terminal, and calculates the temperature corresponding to the detected potential.

The heating controller 33 supplies a current (for example, approximately 10 mA) to the heating unit 23 by applying a predetermined driving voltage to the pad 24f, which functions as the heating terminal, so as to generate heat. The heating controller 33 controls the amount of heat by controlling the predetermined driving voltage applied to the pad 24f.

The failure determining unit 34 determines the occurrence of a failure, based on the relative humidity measured by the humidity measuring processor 31 and also the temperature measured by the temperature measuring processor 32. When determining the occurrence of a failure, the failure determining unit 34 outputs, to the heating controller 33, an instruction to start and finish applying heat.

For example, the failure determining unit 34 acquires the measured humidity H1 from the humidity measuring processor 31 and obtains the temperature T1 from the temperature measuring processor 32 in an initial state in which the heating unit 23 does not generate heat. Then, the failure determining unit 34 causes the heating unit 23 to start generating heat, and acquires the measured humidity H2 from the humidity measuring processor 31 and the temperature T2 from the temperature measuring processor 32 after a predetermined period of time has elapsed.

When the temperature increases by heating (T2>T1) and the humidity decreases by heating (H2<H1), the failure determining unit 34 determines that the humidity sensor 10 is functioning normally. In cases other than the above, the failure determining unit 34 determines that the humidity sensor 10 is malfunctioning.

[Effects]

In the above-described embodiment, the ESD protection circuits 60 are connected to the respective pads 24b through 24f, which function as input terminals or output terminals of the sensor chip 20. Therefore, if an ESD surge is applied to the sensor chip 20 and enters through the pads 24a to 24f in the manufacturing process, the ESD surge can be released to the ground. Accordingly, electrostatic breakdown of internal circuits such as the humidity detecting unit 21, the temperature detecting unit 22, and the heating unit 23 is prevented. In particular, dielectric breakdown and material modification of the humidity sensing film 86 of the humidity detecting unit 21 due to an ESD surge can be prevented.

For a related-art sensor chip, due to static electricity generated in manufacturing equipment or a human body, there may be a possibility that electrostatic breakdown may occur until the sensor chip is mounted on, for example, an ASIC chip after a device pattern is formed on a wafer and the wafer is cut into chips. Such electrostatic breakdown may lead to a reduced yield. Conversely, in above-described embodiment, the sensor chip 20 is equipped with the ESD protection circuits 60 at the time when a device pattern is formed on a wafer, thus enabling high resistance to electrostatic breakdown and improvement in yield.

In the sensor chip 20 having the metal-oxide-semiconductor (MOS) type ESD protection circuits 60, the gate electrodes 74 are formed of an electrically conductive material such as polycrystalline silicon, which is different from the material of the wiring layers 120 and 121 of the temperature detecting unit 22.

If the gate electrodes 74 are arranged at a low density on the sensor chip 20, the processing accuracy of the electrically conductive material may be decreased, and the yield may be reduced. Therefore, in the above-described embodiment, the dummy patterns 78 formed of the same electrically conductive material as the gate electrodes 74 are formed on the sensor chip 20. By forming the dummy patterns 78, the arrangement density of the electrically conductive material improves, and the yield thus improves.

Further, in the above-described embodiment, the dummy patterns 78 are not formed below the signal lines 201 through 204. Accordingly, parasitic capacitance can be suppressed and the drive load can be reduced.

[Variation of Dummy Patterns]

Next, a variation of dummy patterns will be described.

In the above-described embodiment, the components 78a of the dummy patterns 78 have a rectangular shape, with the longer side being in the X direction. However, the lengths Lx and Ly may be changed as appropriate. Preferably, the lengths Lx and Ly may be set in a range that does not cause cracks due to the film stress. Further, the intervals of the components 78a in the X direction and in the Y direction may also be changed as appropriate.

If the arrangement density is low, the arrangement density may be increased by increasing the lengths Lx and Ly or decreasing the intervals.

Further, the shape of each of the components 78a is not limited to a rectangular shape, and may be any other shape such as a circular shape or an oval shape. In terms of increasing the arrangement density, the components 78a each preferably have a rectangular shape.

Further, in the above-described embodiment, the components 78a are arranged in a lattice pattern, but may be arranged in a staggered pattern in which odd-numbered rows are shifted in the row direction by half an array pitch.

Further, in the above-described embodiment, the material of the gate electrodes 74 and the dummy patterns 78 is polycrystalline silicon. However, the gate electrodes 74 and the dummy patterns 78 may be made of any other electrically conductive material such as metal.

Further, in the above-described embodiment, the dummy patterns 78 are not provided on the heating unit 23. However, the dummy patterns 78 may be provided on the heating unit 23 in order to improve the arrangement density. The dummy patterns 78 are preferably provided as many as possible without departing from the layout design rules.

[Variation of ESD Protection Circuit]

Next, an ESD protection circuit according to a variation will be described.

Figure 19:
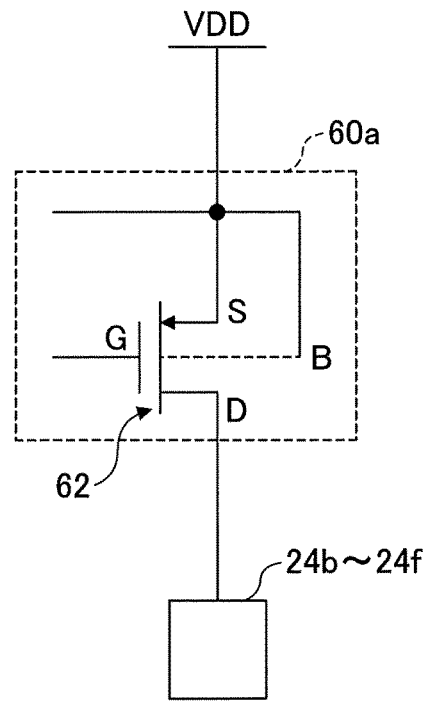
FIG. 19 is a circuit diagram illustrating an ESD protection circuit according to a variation.

FIG. 19 is a circuit diagram illustrating a configuration of an ESD protection circuit 60a. As illustrated in FIG. 19, a diode 62 constituting the ESD protection circuit 60a is formed by a P-channel metal-oxide-semiconductor (MOS) transistor (hereinafter referred to as a PMOS transistor). The diode 62 have a source, a gate, and a back gate that are short-circuited (that is, diode-connected). The short-circuited part of the PMOS transistor functions as an anode of the diode 62, and a drain of the PMOS transistor functions as a cathode of the diode 62.

In the present variation, the ESD protection circuit 60a is electrically connected between power supply wiring and each of the pads 24b to 24f. The power supply voltage (VDD) may be a driving voltage applied to the electrode 83. In other words, the ESD protection circuit 60a may be connected between the pad 24b, which functions as a lower electrode terminal, and each of the pads 24c to 24f.

Figure 20:
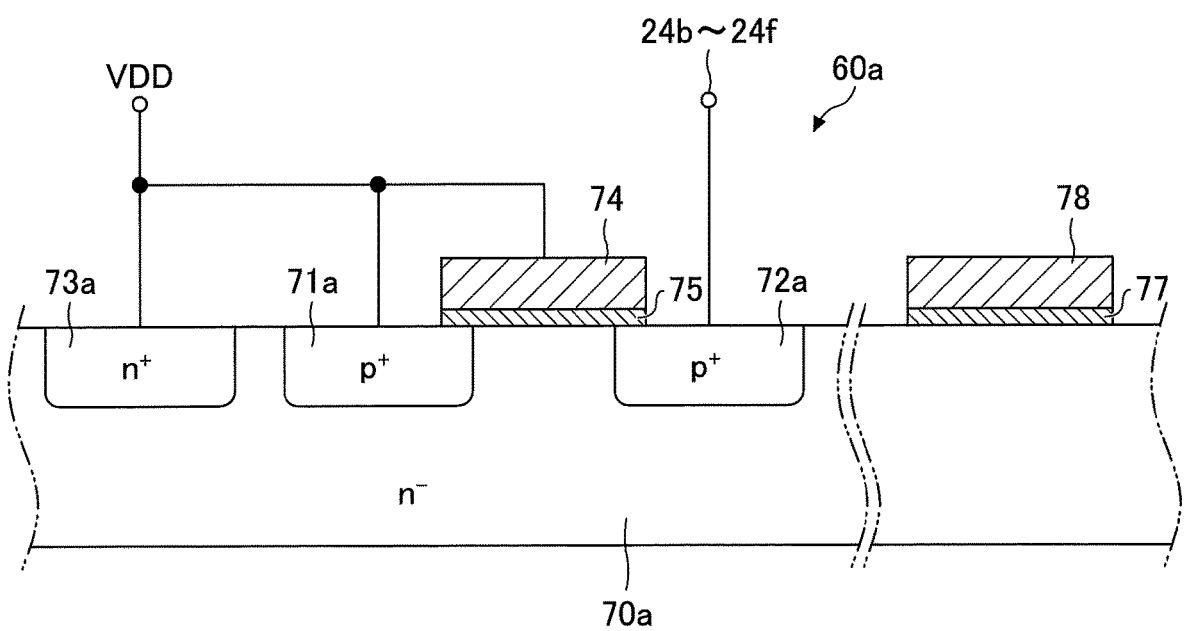
FIG. 20 is a diagram illustrating a layer structure of an ESD protection circuit according to the variation.

FIG. 20 is a diagram illustrating the layered structure of the PMOS transistor forming the ESD protection circuit 60a. In the present variation, an n-type semiconductor substrate 70a is employed, for example. The PMOS transistor includes two p-type diffusion layer 71a and 72a formed in the surface layer of the n-type semiconductor substrate 70a, a contact layer 73a, and a gate electrode 74. The gate electrode 74 is disposed between the two p-type diffusion layer 71a and 72a.

For example, the p-type diffusion layer 71a functions as the source, and the p-type diffusion layer 72a functions as the drain. The contact layer 73a is a low-resistance layer (n-type diffusion layer) for making an electrical connection to the n-type semiconductor substrate 70a, which functions as the back gate. The p-type diffusion layer 71a, the gate electrode 74, and the contact layer 73a are connected in common and short-circuited. The short-circuited part functions as the anode, and the p-type diffusion layer 72a functions as the cathode.

The n-type semiconductor substrate 70a may be an n-type silicon substrate. In the present variation, the sensor chip 20 preferably includes the n-type semiconductor substrate 70. In this case, the heating unit 23 may be formed of a p-type diffusion layer, for example.

Further, the PMOS transistor forming the ESD protection circuit 60a may be formed in an n-well provided in a p-type semiconductor substrate.

Further, the ESD protection circuit is not necessarily formed by either the NMOS transistor or the PMOS transistor, and may be formed by combining the NMOS transistor and the PMOS transistor.

Further, in the above-described embodiment, the humidity sensor 10 has the stacked structure in which the sensor chip 20 is stacked on the ASIC chip 30. However, the present invention may also be applied to humidity sensors that have a structure different from the stacked structure.

Further, in the above-described embodiment, the humidity detecting unit 21 serves as a capacitance-change-type humidity sensor. However, the humidity detecting unit 21 may serve as a resistance-change-type humidity sensor such as a piezo-resistance humidity sensor that detects changes in resistance of the humidity sensing film based on adsorption and desorption of water molecules.

Further, the present invention may be applied to any sensor that detects a physical quantity other than humidity. Namely, instead of the humidity detecting unit 21, a detecting unit that outputs a signal in accordance with a physical quantity other than humidity may be employed.

Further, in the present specification, the positional relationship between two elements, represented by terms such as "cover" and "on", includes both cases in which a first element is indirectly disposed on the surface of a second element via another element and in which the first element is directly disposed on the second element.

Further, the present invention is not limited to these embodiments. Variations and modifications may be made to the described subject matter without departing from the scope of the present invention.

What is claimed is:

1. A sensor comprising:
   a semiconductor substrate;
   a detection unit including (i) a detector disposed above the semiconductor substrate and configured to output a signal in accordance with a physical quantity, and (ii) a reference capacitor that outputs a reference value with respect to a value obtained from the detector;
   an electrostatic discharge protection circuit including a metal-oxide-semiconductor transistor, a gate electrode being included in the electrostatic discharge protection circuit;
   a dummy pattern, different than the reference capacitor, formed above the semiconductor substrate, and formed of a same material as a material of the gate electrode; the dummy pattern formed in regions other than the detection unit and the electrostatic discharge protection circuit; and
   a processor that determines an amount of the physical quantity based on a difference between a value obtained from the detector and the reference value output by the reference capacitor;
   wherein the gate electrode and the dummy pattern are arranged above the semiconductor substrate, and an arrangement density of the gate electrode and the dummy pattern is greater than or equal to 10%.

2. The sensor according to claim 1, wherein the dummy pattern is formed in a region other than a region where a signal line connected to the detector is disposed.

3. The sensor according to claim 1, wherein the gate electrode and the dummy pattern are formed of polycrystalline silicon.

4. The sensor according to claim 1, wherein the dummy pattern is formed by arranging a plurality of components each having a rectangular shape.

5. The sensor according to claim 1, wherein the detector includes a humidity detecting capacitor and outputs a signal in accordance with humidity, the humidity detecting capacitor having a pair of electrodes and a humidity sensing film disposed between the pair of electrodes.

6. The sensor according to claim 5, wherein the humidity detecting capacitor has a lower electrode formed above the semiconductor substrate, an upper electrode formed on the humidity sensing film, and the humidity sensing film disposed between the lower electrode and the upper electrode.

7. The sensor according to claim 6, wherein the reference capacitor has a lower electrode, a reference electrode disposed between the semiconductor substrate and the lower electrode, and an insulating film disposed between the reference electrode and the lower electrode.

8. The sensor according to claim 5, wherein the humidity sensing film is formed of a polyimide.

9. The sensor according to claim 1, further comprising:
a first semiconductor chip including the semiconductor substrate and the detector; and
a second semiconductor chip including a driver configured to drive the detector and also including a charge-to-voltage converter configured to convert an electric charge into a voltage, the electric charge being output from the detector,
wherein the first semiconductor chip is stacked on the second semiconductor chip.

10. The sensor according to claim 9, wherein the driver applies alternate current drive signals to the detector.

11. A sensor comprising:
a semiconductor substrate;
a detection unit including (i) a detector disposed above the semiconductor substrate and configured to output a signal in accordance with a physical quantity, and (ii) a reference capacitor that outputs a reference value with respect to a value obtained from the detector;
an electrostatic discharge protection circuit including a metal-oxide-semiconductor transistor, a gate electrode being included in the electrostatic discharge protection circuit; and
a plurality of dummy patterns, different than the reference capacitor, formed above the semiconductor substrate and formed of a same material as a material of the gate electrode; the dummy pattern formed in regions other than the detection unit and the electrostatic discharge protection circuit.

12. A sensor comprising:
a semiconductor substrate;
a detection unit including (i) a detector disposed above the semiconductor substrate and configured to output a signal in accordance with a physical quantity, and (ii) a reference capacitor that outputs a reference value with respect to a value obtained from the detector;
an electrostatic discharge protection circuit including a metal-oxide-semiconductor transistor, a gate electrode being included in the electrostatic discharge protection circuit;
a dummy pattern, different than the reference capacitor, formed above the semiconductor substrate and formed of a same material as a material of the gate electrode; the dummy pattern formed in regions other than the detection unit and the electrostatic discharge protection circuit; and
a processor that determines an amount of the physical quantity based on a difference between a value obtained from the detector and the reference value output by the reference capacitor.

* * * * *